United States Patent [19]

Onuki

[11] Patent Number: 4,739,827
[45] Date of Patent: Apr. 26, 1988

[54] HEAT EXCHANGER

[75] Inventor: Tadayoshi Onuki, Sagamihara, Japan

[73] Assignee: Fanuc Ltd, Japan

[21] Appl. No.: 22,636

[22] PCT Filed: Jun. 11, 1986

[86] PCT No.: PCT/JP86/00290
§ 371 Date: Jan. 30, 1987
§ 102(e) Date: Jan. 30, 1987

[87] PCT Pub. No.: WO86/07441
PCT Pub. Date: Dec. 18, 1986

[30] Foreign Application Priority Data

Jun. 15, 1985 [JP] Japan .................. 60-129138

[51] Int. Cl.$^4$ .............................. F28F 7/00
[52] U.S. Cl. ................. 165/165; 165/104.34
[58] Field of Search ............ 165/165, 164, 104.34

[56] References Cited
FOREIGN PATENT DOCUMENTS 2504692 8/1975 Fed. Rep. of Germany ...... 165/165
2343215 9/1977 France .................................. 165/165

Primary Examiner—Albert W. Davis, Jr
Attorney, Agent, or Firm—Staas & Halsey

[57] ABSTRACT

An improvement applicable to a plate type heat exchanger for the purpose to make the fabrication thereof easier and to improve the strength and airtightness thereof. A heat exchanger which is provided: a body (1) of a formed plate having a cross-section of rectangular wave form, a top end cover (2) of a formed plastics, having a plurality of projections (22) arranged facing the top openings (11) of said body (1), a plurality of said projections (22) of which the numbers are odd (or even) having openings (23) thereon, and each of the adjacent ones of said plurality of projections (22) being separated by a slit (21) in which the top end of said body (1) of a formed plate is inserted, and a bottom end cover (3) of a formed plastics, having a plurality of projections (32) arranged facing the bottom openings (12) of said body (1), a plurality of said projections (32) of which the numbers are even (or odd) having openings (33) thereon, and each of the adjacent ones of said plurality of projections (32) being separated by a slit (31) in which the bottom end of said body (1) of a formed plate is inserted.

1 Claim, 5 Drawing Sheets

HEAT EXCHANGER

FIELD OF THE INVENTION

1. Background of the Invention

This invention relates to an improvement applicable to a plate type heat exchanger. More specifically, this invention relates to an improvement applicable to a plate type heat exchanger which is employable for cooling the inside of an electronic control cubile or the like in which electronic components are confined or housed.

2. Description of the Related Art

FIG. 1 illustrates the plan view of a plate type heat exchanger which is employable for cooling the inside of an electronic control cubicle or the like. The plate type heat exchanger does not comprise a chamber through which a cooling fluid flows alternately with a fluid to be cooled, but comprises a combination of a cooling fluid path and a cooled fluid path. A cooling fluid continuously flows in the cooling fluid path and a fluid to be cooled continuously flows in the cooled fluid path, thereby the cooling fluid cools the fluid to be cooled through a wall which separates the cooling fluid path and the cooled fluid path. This heat exchanger has an advantage to effectively protect the inside of an electronic control cubicle from a potential contamination by dusts, harmful chemical materials, etc. Referring to FIG. 1, the numeral 4 indicates tubular fluid path having a rectangular cross-section. A plurality of tubes 4, each of which is struck to each other in parallel to each other, is placed in a direction vertical to the page of the drawing. The tubes of which the numbers are odd (first tube, third tube, etc) have, for example, a cooling fluid A flow through them, and the tubes of which the numbers are even (second tube, fourth tube, etc.) have for example, a fluid to be cooled flow through them. Heat is thereby transmitted between the cooling fluid and the fluid to be cooled through walls 5 which separate the fluid paths 4 placed side by side.

An example of the conventional methods for fabricating the plate type heat exchanger having the aforementioned structure will be described below. Referring to FIG. 2, a thin metal plate 6 is formed to a rectangular wave formed plate. Referring to FIG. 3, the rectangular wave formed plate 6 is inserted in an external shell 7 of the heat exchanger (a tube having a large rectangular cross-section or a box from which the top and bottom plates are removed), before the top and bottom openings of the external shell 7 are closed with sealing members 8 of rubber or the like which are stuck to the external shell 7 with an adhesive or the like.

The numeral 81 indicates inlets or outlets of the fluids A, B. The cooling fluid A and the fluid to be cooled B respectively flow in the fluid paths 4 respectively having every other number. Namely, the cooling fluid A flows in the fluid flow paths 41, 43 and 45, and the fluid to be cooled B flows in the fluid flow paths 42, 44 and 46. In other words, the fluid flow paths having the odd numbers (or even numbers) have the cooling fluid A and the fluid flow paths having the even numbers (or odd numbers) have the fluid to be cooled B. Heat is exchanged between the cooling fluid A and the fluid to be cooled B through the wall of the formed thin metal plate 6. The other equipment necessarily attached to the plate type heat exchanger includes a duct (not shown) connecting the inlets (or outlets) 81 of the fluid paths 41, 43 and 45 in which the cooling fluid A flows, each other, the duct (not shown) connecting the inlets (or outlets) 81 of the fluid paths 42, 44 and 46 in which the fluid to be cooled B flows, each other, a pushing fan (not shown), a pulling fan, et al. The flow directions of the cooling fluid A and the fluid to be cooled B can be freely selected. In other words, they can be either same to each other or reverse to each other.

As was described above, the plate type heat exchanger having the aforementioned structure available in the prior art is fabricated with a method comprising a step to form a thin metal plate 6 to a rectangular wave formed plate, a step to insert the thin metal plate formed to a rectangular wave formed plate 6 into an external shell 7, and a step to close the top and bottom openings of the external shell 7 with sealing members 41, 42, 43, 44, 45 and 46 of rubber or the like which are stuck to the external shell 7 with an adhesive or the like, for the purpose of producing a plurality of fluid paths 4 each of which is arranged in parallel side by side. Since the sealing process inherently needs a considerable length of working time or manpower, the aforementioned method for fabricating a plate type heat exchanger is involved with a drawback wherein the manufacturing cost is high.

To remove this drawback, I developed a plate type heat exchanger illustrated in FIG. 4 and which comprises a body 1 of a formed plate having a cross-section of rectangular wave form, a top end cover 2 of a formed plate having plural top closing members 24 for closing the top openings 11 of the body 1 of which the numbers are odd (or even), and a bottom end cover 3 of a formed plate having plural bottom closing members 34 for closing the bottom openings 12 of the body 1 of which the numbers are even (or odd).

This improved heat exchanger has successfully realized advantages that the fabrication process is easy, the hardness or strength thereof is improved in all the directions, and the construction thereof is a sort of "monocoque body", thereby the strength is sizably improved. However, since this improved heat exchanger has the top and bottom end covers 2, 3 which are formed objects of thin plates, as shown in FIG. 4, the improved heat exchanger is still involved with drawbacks wherein a considerable amount of manpower or working time is required to assemble the top and bottom end covers 2, 3 with the body 1, the strength is not necessarily sufficient, unless the thickness of the plates, particularly of the top and bottom end covers 2, 3, is sizably large.

SUMMARY OF THE INVENTION

An object of this invention is to provide a plate type heat exchanger comprising a body of a formed plate having a cross-section of rectangular wave form, a top end cover having plural top closing members for closing the top openings of the body of which the numbers are odd (or even), and a bottom end cover having plural bottom closing members for closing the bottom openings of the body of which the numbers are even (or odd), wherein the alignment of the body is easier, the fabrication process thereof is easier, and the strength and airtightness thereof are better.

A heat exchanger in accordance with this invention which satisfies the aforementioned object is provided:

(a) a body 1 of a formed plate having a cross-section of rectangular wave form, (b) a top end cover 2 of a formed plastics, having a plurality of projections 22 arranged facing the top openings 11 of said body 1, a plurality of said projections 22 of which every other projection 22 has openings 23 thereon, and each of the adjacent ones of said plurality of projections 22 being separated by a slit 21 in which the top end of said body 1 of a formed plate is inserted, and (c) a bottom end cover 3 of a formed plastics, having a plurality of projections 32 arranged facing the bottom openings 12 of said body 1, a plurality of said projections 32 of which every other projection 32 has openings 33 thereon, and each of the adjacent ones of said plurality of projections 32 being separated by a slit 31 in which the bottom end of said body 1 of a formed plate is inserted.

BRIEF DESCRIPTION OF THE DRAWINGS

A more detailed description will be presented below for a heat exchanger in accordance with an embodiment of this invention, referring to drawings tabulated below.

DETAILED DESCRIPTION OF A PREFERRED EMBODIMENT

Figure 1:
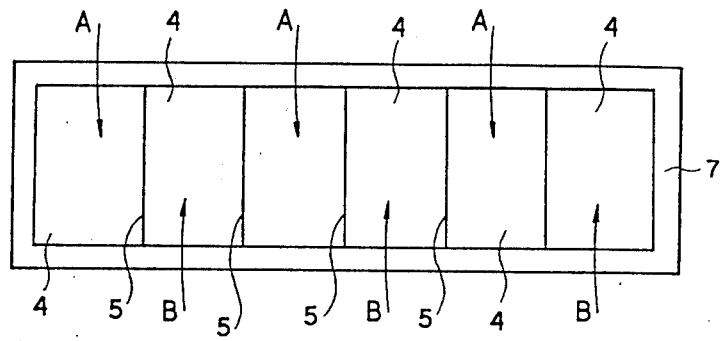
FIG. 1 is a plan view of a plate type heat exchanger available in the prior art.
Figure 2:
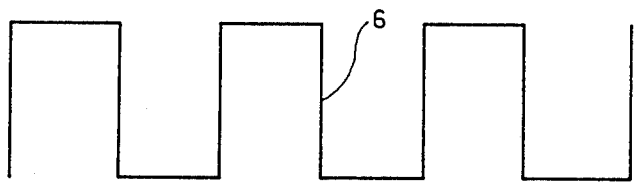
FIG. 2 is a plan view of a thin metal formed plate constituting heat exchange elements of a plate type heat exchanger available in the prior art.
Figure 3:
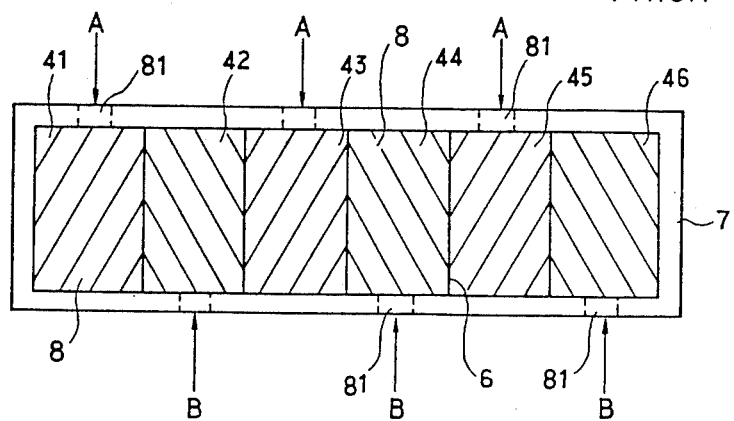
FIG. 3 is a plan view of the top end of a plate type heat exchanger available in the prior art.
Figure 4:
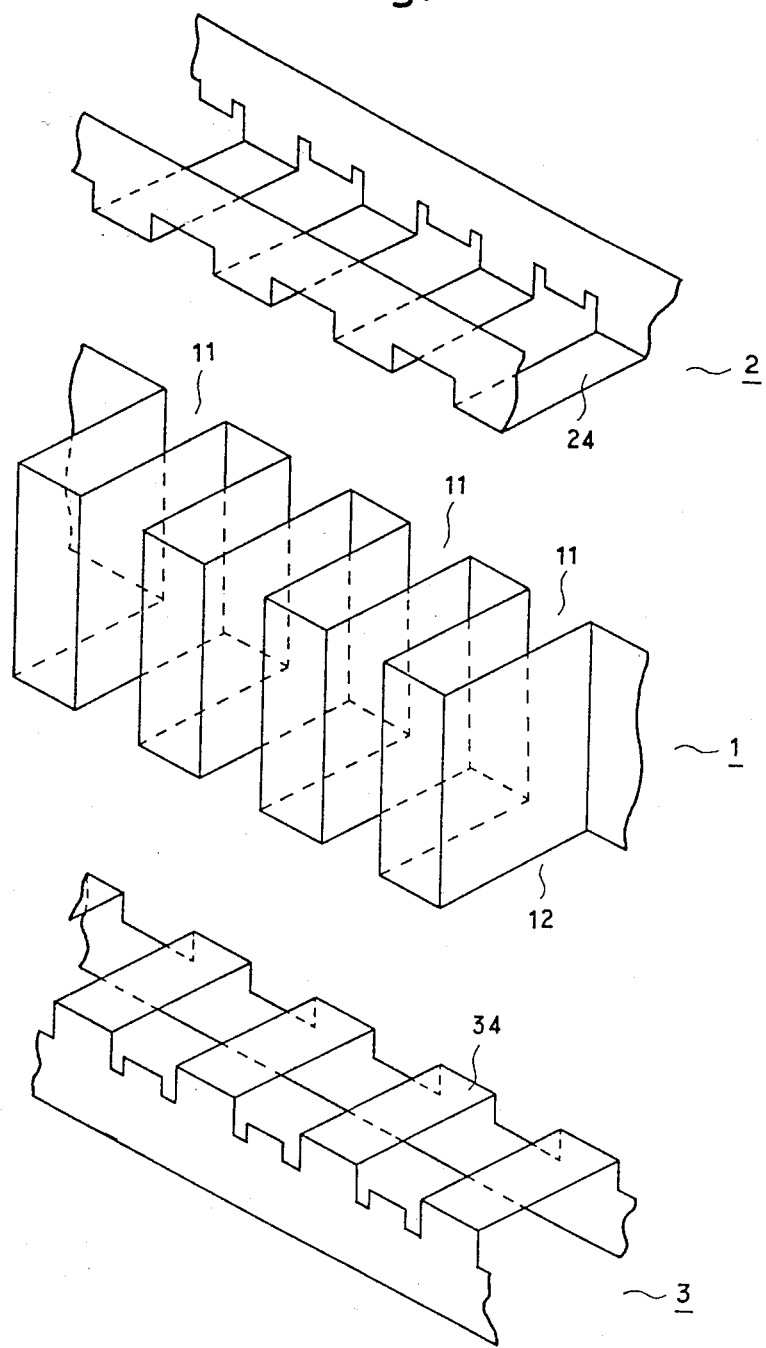
FIG. 4 is a partly disassembled perspective view of an improved plate type heat exchanger available in the prior art.
Figure 5:
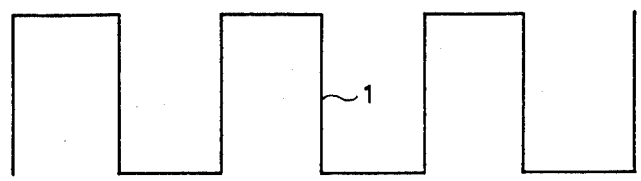
FIG. 5 is a plan view of the body of a heat exchanger in accordance with one embodiment of this invention.

Referring to FIG. 5, a plane plate of a metal or the like is formed to a body 1 having a cross-section of rectangular wave form.

Figure 6:
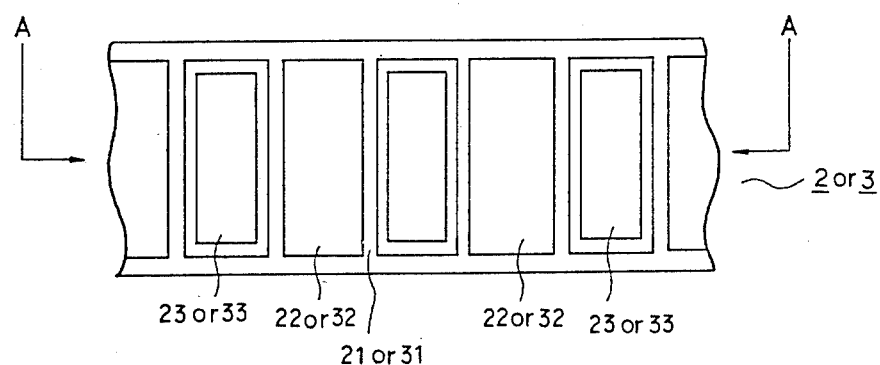
FIG. 6 is a plan view of the top or bottom end cover of a heat exchanger in accordance with one embodiment of this invention (the construction of the top and bottom end covers is virtually identical to each other)

Referring to FIG. 6, top and bottom end covers 2, 3 having a plan view thereof shown in FIG. 6 are formed with a plastic material. Each of the top and bottom end covers 2, 3 has a plurality of rectangular projections 22, 32 facing the top or bottom openings 11, 12 of the body 1, and each of the rectangular projections 22, 32 is separated by a slit 21, 31 to which the top or bottom end of the plate constituting the body 1 is inserted. Every other of the rectangular projections 22, 32 has openings 23, 33 thereon. The openings 23 of the top end cover 2 face the top openings 11 of the body 1 and the openings 33 of the bottom end cover 3 face the bottom openings 12 of the body 1.

Figure 7:
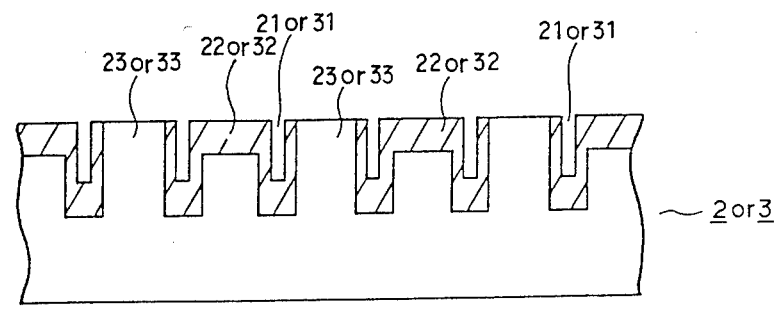
FIG. 7 is an A—A cross-sectional view of the top or bottom end cover of a heat exchanger of FIG. 6 in accordance with one embodiment of this invention seen from the A—A direction (The construction of the top and bottom end covers is virtually identical to each other.)

Referring to FIG. 7, the cross-section of the top and bottom end covers 2, 3 is made hollow to an extent in which the rigidity or strength thereof is sufficient.

It is inherently possible to produce a formed plastic of any complicated shape having a large magnitude of rigidity or strength by properly selecting the thickness thereof, resultantly having a lower possibility of being deformed during the fabrication process therewith. The aforementioned top and bottom end covers 2, 3 are of course allowed to enjoy these advantages.

Figure 8:
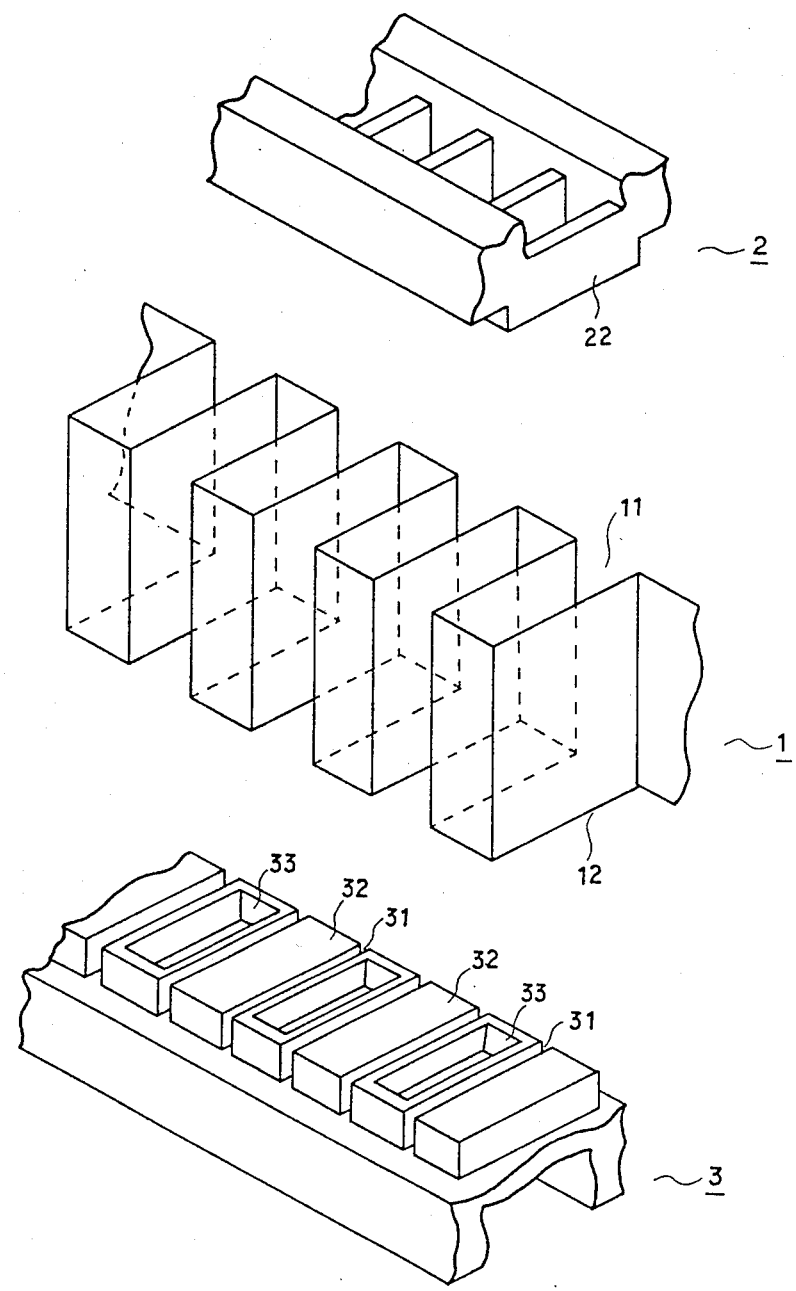
FIG. 8 is a partly disassembled perspective view of a heat exchanger in accordance with one embodiment of this invention.

Referring to FIG. 8, the top end of the thin metal plate which constitutes the body 1 is inserted into the slits 21 which separate the projections 22 of the top end cover 2 in the manner that the top openings 11 of the body 1 are aligned to the projection 22 of the top end cover 2, for the purpose to assemble the top end cover 2 with the body 1. Needless to emphasize, the top openings 11 of the body 1 of which the numbers are odd (or even) must be combined with the openings 23 of the top end cover 2.

In the same manner, the bottom end of the thin metal plate which constitutes the body 1 is inserted into the slits 31 which separate the projections 32 of the bottom end cover 3 in the manner that the bottom openings 12 of the body 1 are aligned to the projections 32 of the bottom end cover 3, for the purpose to assemble the bottom end cover 3 with the body 1. Needless to emphasize, the bottom openings 12 of the body 1 of which the numbers are even (or odd) must be combined with the openings 33 of the bottom end cover 3 so as to offset the cover openings. Since the projection 22, 32 are allowed to act as "jigs" during the aforementioned assembly process, provided the depth and width of the slits 21, 31 are selected to an optimum value, it is effective to make the assembly process easier and to enhance the magnitude of airtightness of the heat exchanger.

Figure 9:
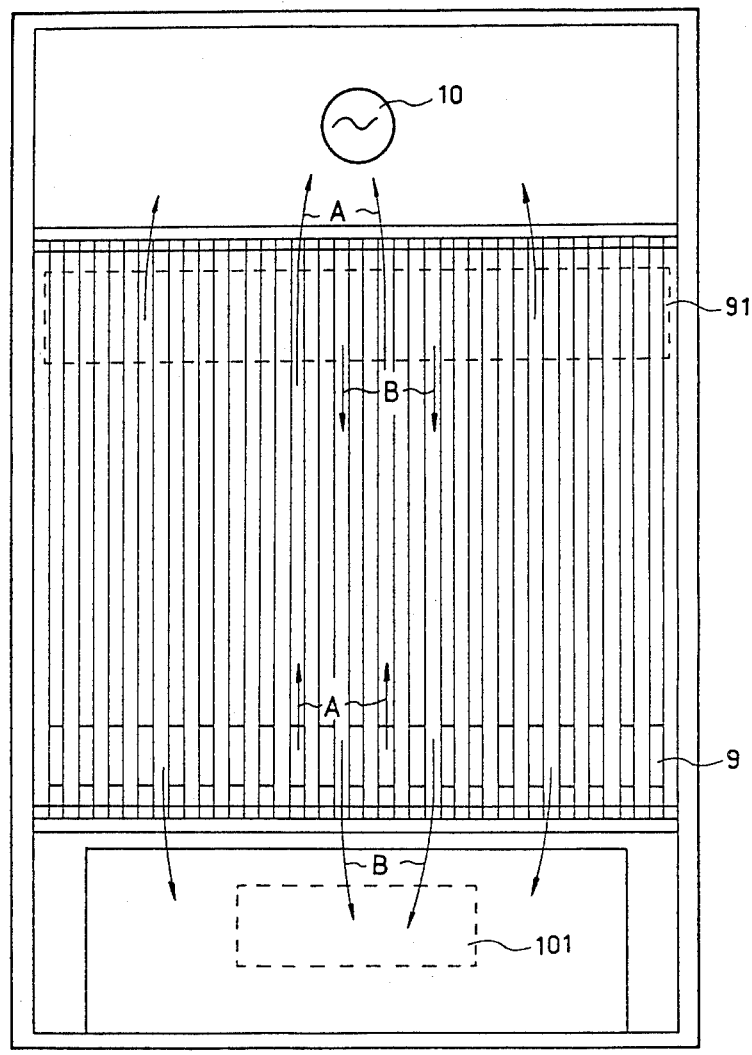
FIG. 9 is a front view of a heat exchanger in accordance with one embodiment of this invention.

FIG. 9 illustrates the front view of a complete plate type heat exchanger in accordance with one embodiment of this invention. The cooling fluid A flows into the body 1 through the cooling fluid inlet 9 which is arranged at the front bottom of the body 1 of the heat exchanger, before it flows upward in the body 1 and is drafted outward by a fan 10 arranged at the front top of the heat exchanger. On the other hand, the fluid to be cooled B flows from the inside of an electronic cubicle into the body 1 of the heat exchanger through the inlet 91 of the fluid to be cooled which is arranged at the rear top of the body 1 of the heat exchanger, before it flows downward in the body 1 of the heat exchanger and is drafted into the electronic cubicle through an outlet 101 arranged at the rear bottom of the heat exchanger. A drafting fan (not shown) can be arranged at the outlet 101.

The foregoing description has clarified that a plate type heat exchanger comprising a body of a formed plate having a cross-section of rectangular wave form, a top end cover having plural top closing members for closing the top openings of the body of which the numbers are odd (or even), and a bottom end cover having plural bottom closing members for closing the bottom openings of the body of which the numbers are even (or odd), wherein the alignment of the body is easier, the fabrication process thereof is easier, and the strength and airtightness thereof are better, has successfully provided.

Although the foregoing description was presented referring to a specific embodiment, this is not meant to be construed in a limiting sense. Various modifications of the disclosed embodiment, as well as other embodiments of this invention, will be apparent to persons skilled in the art upon reference to the description of this invention. It is therefore contemplated that the appended claims will cover any such modifications or embodiments as fall within the true scope of this invention.

What is claimed:
1. A heat exchanger comprising:
   a body of a formed plate having a cross-section of rectangular wave form,
   a top end cover of a formed plastic, having a first plurality of projections arranged facing top openings of said body, said first plurality of projections of which every other projection has openings thereon, and each of the adjacent ones of first said plurality of projections being separated by a slit in which the top end of said body of a formed plate is inserted, and
   a bottom end cover of a formed plastic, having a second plurality of projections arranged facing bottom openings of said body, said second plurality of projections of which every other projection has openings thereon, said second openings being staggered relative to said first openings, and each of the adjacent ones of said second plurality of projections being separated by a slit in which the bottom end of said body of a formed plate is inserted.

* * * * *

UNITED STATES PATENT AND TRADEMARK OFFICE
CERTIFICATE OF CORRECTION

PATENT NO. : 4,739,827
DATED : April 26, 1988
INVENTOR(S) : Tadayoshi Onuki

It is certified that error appears in the above-identified patent and that said Letters Patent is hereby corrected as shown below:

* Front page [73] "Japan" should be -- Minamitsuru, Japan --.

Col. 1, line 2, "FIELD OF THE INVENTION" should be
    -- BACKGROUND OF THE INVENTION --;

line 3, "1. Background of the Invention"
          should be -- 1. Field of the Invention --;

line 35, "have" should be -- have, --;
        line 36, "cooled" should be -- cooled B --;
        line 51, "7with" should be -- 7 with --.

Col. 4, line 12, "projection" should be -- projections --.

Signed and Sealed this

Twenty-seventh Day of September, 1988

Attest:

DONALD J. QUIGG

Attesting Officer      Commissioner of Patents and Trademarks